United States Patent [19]

Wolfson et al.

[11] Patent Number: 5,126,932

[45] Date of Patent: Jun. 30, 1992

[54] METHOD AND APPARATUS FOR EXECUTING A PROGRAM IN A HETEROGENEOUS MULTIPLE COMPUTER SYSTEM

[75] Inventors: C. Daniel Wolfson, Langhorne, Pa.; Frederic W. Brehm, Mercerville, N.J.; Maura M. Flatley, South Brunswick Township, N.J.; Ellen M. Voorhees, Plainsboro, N.J.

[73] Assignee: Siemens Corporate Research, Inc., Princeton, N.J.

[21] Appl. No.: 506,503

[22] Filed: Apr. 5, 1990

Related U.S. Application Data

[63] Continuation-in-part of Ser. No. 208,318, Jun. 17, 1988, abandoned.

[51] Int. Cl.⁵ .................... G06F 15/46; G06F 15/16
[52] U.S. Cl. ................................ 364/131; 364/468; 364/DIG. 1; 364/222.2; 364/230; 364/230.4; 364/284.4; 395/200; 395/650
[58] Field of Search ........................ 364/131-136, 364/138, 139, 468, 478, 200 MS File, 900 MS File, 488-491; 340/825.06, 825.07, 825.08

[56] References Cited

U.S. PATENT DOCUMENTS

| | | | |
|---|---|---|---|
| 3,614,745 | 10/1971 | Podvin et al. | 364/200 |
| 4,443,865 | 4/1984 | Schultz et al. | 364/900 |
| 4,450,519 | 5/1984 | Guttag et al. | 364/200 |
| 4,472,783 | 9/1984 | Johnstone et al. | 364/474 |
| 4,473,883 | 9/1984 | Yoshida et al. | 364/474 |
| 4,503,499 | 3/1985 | Mason et al. | 364/200 |
| 4,543,626 | 9/1985 | Bean et al. | 364/200 |
| 4,564,913 | 1/1986 | Yomogida et al. | 364/474.11 |
| 4,591,991 | 5/1986 | Sticht | 364/478 |
| 4,698,629 | 10/1987 | Mori et al. | 364/474.11 |
| 4,731,736 | 3/1988 | Mothersole et al. | 364/900 |
| 4,780,820 | 10/1988 | Sowa | 364/200 |
| 4,821,198 | 4/1989 | Takeuchi et al. | 364/468 |
| 4,829,445 | 5/1989 | Burney | 364/478 |

OTHER PUBLICATIONS

Thesis: Fowler, Robert Joseph: "Decentralized Object Finding Using Forwarding Addresses", Unversity of Washington PH.D. 1985. University Microfilms International, 300 N. Zeeb Road, Ann Arbor, MI 48106; Copyright 1985 by Fowler, Robert Joseph.

Jul et al., Fine-Grained Mobility In The Emerald System, Feb. '88, ACM Trans on Comp. Sys. vol. 6, No. 1. pp. 109–133.

Casais, "An Object Oriented System Implementing KNOs", Apr.-Jul. 1988, SIGOIS Bulletin, vol. 9, No. 2-3, pp. 284-290.

Tsichritzis, "Office Automation", Chapter 15–Objectworld, Springer-Verlag, 1985; pp. 379-399.

*Primary Examiner*—Joseph Ruggiero
*Attorney, Agent, or Firm*—Adel A. Ahmed

[57] ABSTRACT

A program, consisting of data and a plurality of successive operations on the data, is executed on a distributed heterogeneous multiple computer system having a plurality of autonomous nodes each including a processor and associated memory. A control arrangement initiates execution of the program on a first autonomous node in the multiple computer system. A coupling arrangement transfers execution of the program to a second autonomous node in the multiple computer system in response to one of the successive operations in the program.

15 Claims, 3 Drawing Sheets

METHOD AND APPARATUS FOR EXECUTING A PROGRAM IN A HETEROGENEOUS MULTIPLE COMPUTER SYSTEM

CROSS-REFERENCE TO RELATED APPLICATION

This is a continuation-in-part of Ser. No. 07/208,318 filed Jun. 17, 1988, abandoned.

The present invention relates to a method and apparatus for executing a program in a heterogeneous multiple computer system.

DESCRIPTION OF THE PRIOR ART

Multiple computer systems which include nodes each implemented by the same type of processing equipment and each having access to identical resources (e.g. peripheral equipment, data and programs) are designated homogeneous systems. In such systems, it is known how to transport an executing program from one node to another. Such known systems may transfer executing programs either transparently to the program, as for load balancing, or in response to requests by the program itself.

Multiple computer systems which include nodes each implemented by different types of processing equipment and/or each having access to different resources (e.g. different peripheral equipment, different data or different programs) are designated heterogeneous systems. It is more difficult to transport executing programs among nodes in a heterogeneous system than in a homogeneous system, because the processing environment at each node of the heterogeneous system may be different from that at the other nodes. It is known how to transfer non-executing programs to specific nodes. It is sometimes desirable, however, that an executing program in such a system begin execution on a first processor, at a first node in the multiple computer system, and then, at the request of the program, continue execution on a second processor, at a second node in the system. This has previously entailed breaking the complete program down into separate parts to be executed by the processors at the different nodes. The separate parts were then programmed separately for the processors at each node. During execution of the program, control is passed e.g. by remote procedure calls (RPC), and the data associated with the program is forwarded from the first node to the second node by message passing.

This is a relatively inflexible solution, however. To change the program requires redoing the entire programming process. That is, the new program must be broken down into separate parts and the parts programmed separately for the processors at each node. At least the programming step must be redone even if the changes are relatively small. If successive runs of the program entail even slight changes, then reprogramming must be done before each run. It is desirable that a method and apparatus for executing a program on a heterogeneous multiple computer system simplify the programming process, and provide the flexibility to make small changes to the program with minimized time and effort.

SUMMARY OF THE INVENTION

In accordance with principles of the present invention, a method of executing a program, consisting of data and a plurality of successive operations to be performed on the data, in a heterogeneous multiple computer system comprises the following steps. First, initiating execution of the program on a first processor in the multiple computer system. And second, transferring execution of the program to a second processor in the multiple computer system in response to one of the successive operations in the program.

Apparatus in accordance with principles of the present invention includes a heterogeneous multiple computer system for executing a program consisting of data and a plurality of successive operations on the data. The system comprises a control arrangement for initiating execution of the program on a first processor in the multiple computer system, and a coupling arrangement for transferring execution of the program to a second processor in the multiple computer system in response to one of the successive operations in the program.

In an automated factory, work cells may include several control processors and several related machines controlled by the processors. To simplify the following explanation, it will be assumed that each work cell includes a single master control processor, possibly with slave processors attached to it, and several related machines controlled by it. Each work cell, controlled by its master processor, and containing a plurality of related machines, is connected to the other work cells by e.g. a Manufacturing Automation Protocol (MAP) network. Each work cell in such a system may be considered a node in a heterogeneous multiple computer system. The factory operates to process successive work units of raw materials to produce corresponding units of finished materials. The processing of a unit of raw materials may be viewed as a program to be executed by the multiple computer system embodied in the factory. As a unit is processed, it must be transferred among the work cells which will perform the processing steps in the manufacturing process.

In accordance with the present invention, a program (called a router) may be used to uniquely identify a work unit, and to contain all the information necessary to produce a lot of finished material from a lot of raw material. The information contained in the router includes: identification information relating to the work unit; the sequence of processing steps to be performed on the unit; the identity of work cells and machines which may perform these processing steps; parameters to be used by the work cells and machines performing the processing steps; and process results to be used for quality control and as parameters for subsequent processing steps. The router and the work unit travel together through the factory. The router contains programming operations which cause the transfer of both the program and the unit from the present work cell to the next work cell, the selection of which may be based on the information stored in the router.

Such a router may select the next machine to receive the router and the unit in different ways. First, a specific machine may be set forth in the sequence of processing steps stored in the router. For instance, if only one machine may perform the next processing step, then the router and unit is transferred to that machine. Second, different specific machines may be set forth, depending on the processing history of the unit or the capabilities of the machines. In one example, a unit may be sent to the next work cell performing the next processing step if the processing at the current work cell was performed satisfactorily, but may be sent to a different work cell performing a reworking processing step if the processing at the current work cell was not performed satisfactorily. In another example, in semiconductor fabrication related photolithography, any one of the existing projection printers may be used to project the first mask on a particular wafer; thereafter, it is preferred that the first projection printer be used to project all subsequent masks for that wafer, in order to improve registration. The router may be programmed to always send the wafer back to the projection printer which projected the first mask to project all subsequent masks. Third, a set of machines, any one of which is capable of performing the next processing step, may be set forth in the sequence of processing steps stored in the router. For instance, if any one of four identical machines may perform the next processing step, this is set forth in the processing steps of the router. A scheduler (which operates independently from the router) then determines the particular machine of the four to which the router and the unit will be transferred. Fourth, such a router has the capability to select a specific machine to perform the next processing step, based, for example, upon the ability of the specific machines to perform the desired process, and/or upon the previous processing history of the unit.

In an automated office, each work area may have a work station or a personal computer (PC), operated by a different person and linked to the others through a local area network (LAN). Because different persons are operating the different PCs, such a system must be considered a heterogeneous multiple computer system, even if all the PCs are of the same type with identical equipment. It is also possible that the PCs be of different types with different peripheral equipment and/or different data and programs. It may sometimes be required that a document be approved by a predetermined group of persons. To perform the approval process, the document may be transferred to the PC of each of the persons whose approval is needed. In accordance with the present invention, this process may also be considered as a program which is executed by the multiple computer system. In this case a router may be created which contains the document as the data, and the information necessary to route the document to the proper PCs on the LAN as the operation steps. In this case the router may route the document to persons in a particular order, and/or may indicate alternate approvers, any one of which may approve the document. In addition, the router may hold the document in case one of the approvers is not available (e.g. on vacation).

DETAILED DESCRIPTION

Figure 1:
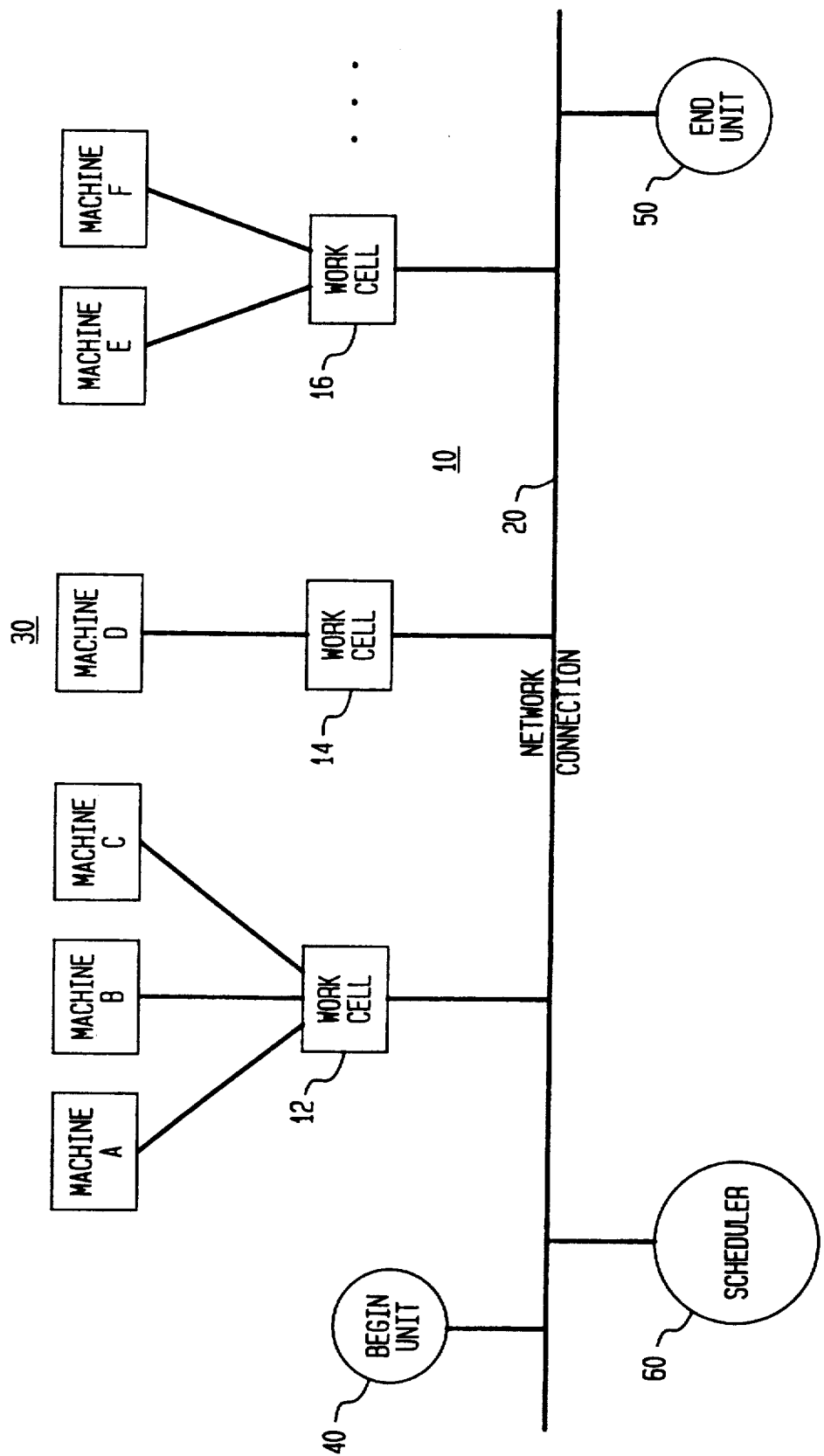
FIG. 1 is a block diagram of a heterogeneous multiple computer system according to the present invention in an automated factory.

FIG. 1 is a block diagram of a heterogeneous multiple computer system embedded in an automated factory. In FIG. 1, a plurality of work cells 10 are connected together via a network connection 20, which may be any of the known multiple computer system networks. Each work cell is connected to respective pluralities of machines 30. A begin unit processor node 40, an end unit processor node 50 and a scheduler node 60 are also connected to the network connection 20.

In operation, each work cell 10 includes a processor which controls the machines 30 connected to that work cell. In FIG. 1, work cell 12 controls machines A, B and C; and work cell 14 controls machine D and work cell 16 controls machines E and F. In an automated factory, these machines are related to each other in some way. For example, they may be physically close to each other, or they may all be the same type of machine, or they may perform related functions.

A router, which is a program containing data and a sequence of operations to be performed on the data, is created by the begin unit processor node 40. The begin unit node 40 may be a computer operated by manufacturing personnel. This computer provides the capability of generating the identification information, process parameters, and processing steps necessary to produce a unit of a particular finished product from a unit of raw materials. The manufacturing computer may contain a library of often used, well tested, standard routers which may be retrieved and associated with the unit. The standard routers may be modified by manufacturing engineering personnel to result in a new router for a unit of desired finished material which is only slightly different from the finished product resulting from execution of the standard router. The manufacturing computer may also contain a library of well tested subroutines which may be combined to produce a new router for new finished products.

In accordance with the present invention, the router is packaged and sent as a complete unit via the network connection 20 to the first work cell at which the work unit is to be processed. The work unit is also sent to that work cell. This may be done either manually by manufacturing personnel, or automatically by automated materials handling equipment, such as computer controlled conveyers. When the router is packaged for transfer to another work cell, it contains not only the program and data portions but also an indication of the state of execution of the router. In a manner similar to multi-programming systems, the state of execution may be a collection of data including an indication of what statement is next to be executed, and the current values of all the variables defined by the program. This information is sufficient to restart a previously halted router at a new work cell.

The processor at the new work cell unpackages the router, and performs the processing steps which pertain to the new work cell. The processor, under control of the router, causes the machines connected to the work cell to perform their processing steps. This causes the unit to be partially processed. The processor may also cause measurements related to the processing of the work unit to be taken. These measurements are recorded in the data portion of the router. This data may be used for quality control and/or as parameters for further processing step at other work cells. The router may also include processing operations which summarize the data for use by quality control or subsequent processing steps and which may transmit the data to other computer systems for their use and analysis.

One of the processing steps in the router may cause the execution of the router to halt at the current work cell. The router is then packaged, and transferred, along with the work unit, to the next work cell. When both the router and the unit arrive at the next work cell, the router is unpackaged, execution of the router is resumed at that work cell, and further processing of the unit is performed. This sequence of initiation, halting, transferring, and resumption of execution of the router is repeated among the different work cells until the unit of finished product is produced. When the unit of finished product is completed, data from the completed router may be stored in the end unit processing node. The stored data may be used for quality control, or for historical analysis.

As described above, a router according to the present invention may specify that any one out of a set of permissible machines should be the next to receive the router and the unit. This may happen, for example, if several machines of the same type exist in the factory. The scheduler processor node 60 gathers information relating to the availability of each one of the set of permissible machines, i.e. which is going to be available next. The scheduler processor node 60 then selects the machine next available and causes the router and the unit to be sent to the work cell containing that machine.

The router may be written in a procedural language because it is used to represent essentially sequential processing. That is, the processing of a unit proceeds essentially as a sequence of processing steps, one after another. This language may then be used to define both the data structure of the router and the sequence of process steps to be performed on the unit and the data. Because the manufacturing process is considered essentially as a program executing on a multiple computer system, software engineering techniques may be used to enhance the design of the router. For example, sequence control operations (similar to the IF, CASE, WHILE, and UNTIL program statements) may be incorporated into a router. In addition, control exception operations (similar to an ON ERROR program statement) may also be incorporated into the router.

The language used to implement the router is interpreted on each work cell. In this way the execution of the router becomes transparent to the work cells and the processor is executing it. An interpreter is designed and implemented on each processor in each work cell in the factory. The interpreter must be able to process the standard language constructs present in the procedural language in which the router is written. These constructs may implement control of and information gathering from the machines in the work cell and store the information gathered in the data section of the router. In addition, the interpreter must process language constructs which cause the execution of the router to halt on this work cell, and cause the router to be packaged and sent either to another work cell specified by the router itself or to one of several work cells as selected by the scheduler processing node 60.

Figure 2:
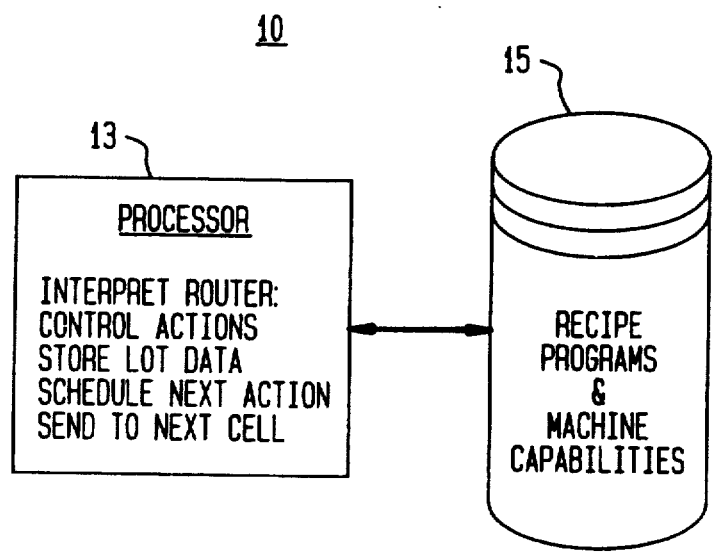
FIG. 2 is a more detailed block diagram of a work cell which may be used in the system illustrated in FIG. 1.

FIG. 2 is a more detailed block diagram of a work cell 10 which may be used in the system illustrated in FIG. 1. Work cell 10 consists of a processor 13 connected to some form of permanent storage 15, for example, a disk drive. The processor 13 includes a central processing unit (CPU); circuitry for connecting the processor to the machines associated with this work cell; and program storage which may include random access memory (RAM). The permanent storage holds software routines which perform the following functions: (1) the interpreter for the language which implements the router; (2) routines for controlling the machines connected to the work cell; (3) routines for gathering process results from the machines and storing them in the router; (4) routines for scheduling the next action of the work cell; that is, determining the sequence of operations of the machines in this work cell; and (5) routines for receiving the router from the previous work cell, unpackaging the router, repackaging the router and transferring it to the next work cell. The permanent storage also stores machine capabilities, and recipe programs for often used sequences of machine operations. When the processor begins operation, those routines are retrieved from the permanent storage and placed in the RAM where the processor can access them for execution.

When a router is received at a work cell from another work cell, the state information is extracted from the package and the router is restored to the state it was in when execution was halted on the previous work cell. Execution of the router is resumed at the present work cell. The interpreter executes the statements in the router, accessing the routines (described above) as required to control the machines and gather process results. When a statement requiring the transfer of the router to another work cell is encountered, the current state of the router is packaged with the router and it is sent to the next indicated work cell.

Figure 3:
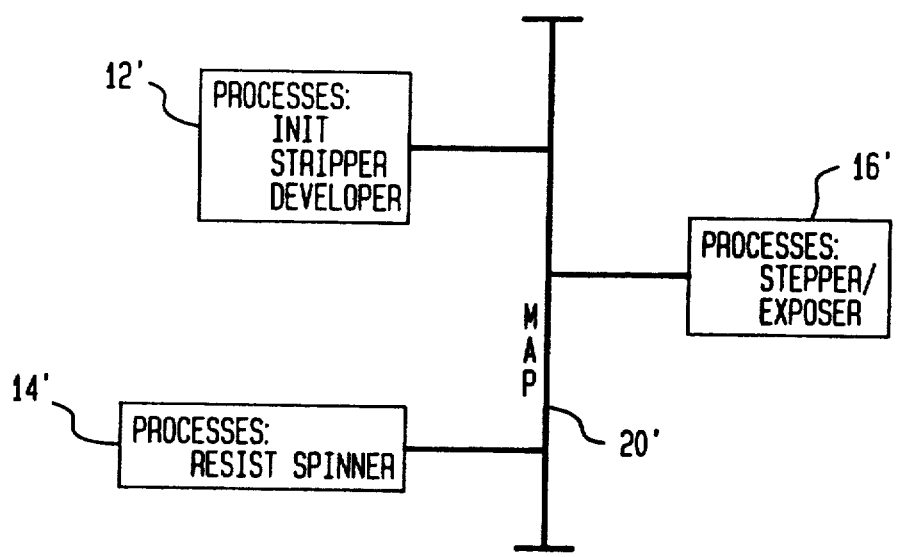
FIG. 3 is a block diagram illustrating the allocation of manufacturing application processes to work cells illustrated in FIG. 1.

The operation of a portion of a router which may be used to perform a part of the photolithographic portion of the semiconductor fabrication process will be described below. FIG. 3 illustrates the allocation of the processes necessary to perform this portion the semiconductor fabrication to specific work cells. In FIG. 3, three work cells: 12', 14' and 16' are illustrated which perform the indicated processes and which may communicate via the MAP network 20'. At work cell 12', processes are performed which initialize some variables in the router, which develop a previously exposed photoresist mask and which strip an incorrectly applied exposed photoresist mask. At work cell 14' a process is performed which applies photoresist to a wafer. At work cell 16', a process is performed which exposes previously applied photoresist. The MAP network 20' may be connected to other work cells (not shown). As described above, a router is transferred among the work stations which will execute these processes. The operation of the portion of the router will be better understood by referring to FIG. 4.

Figure 4:
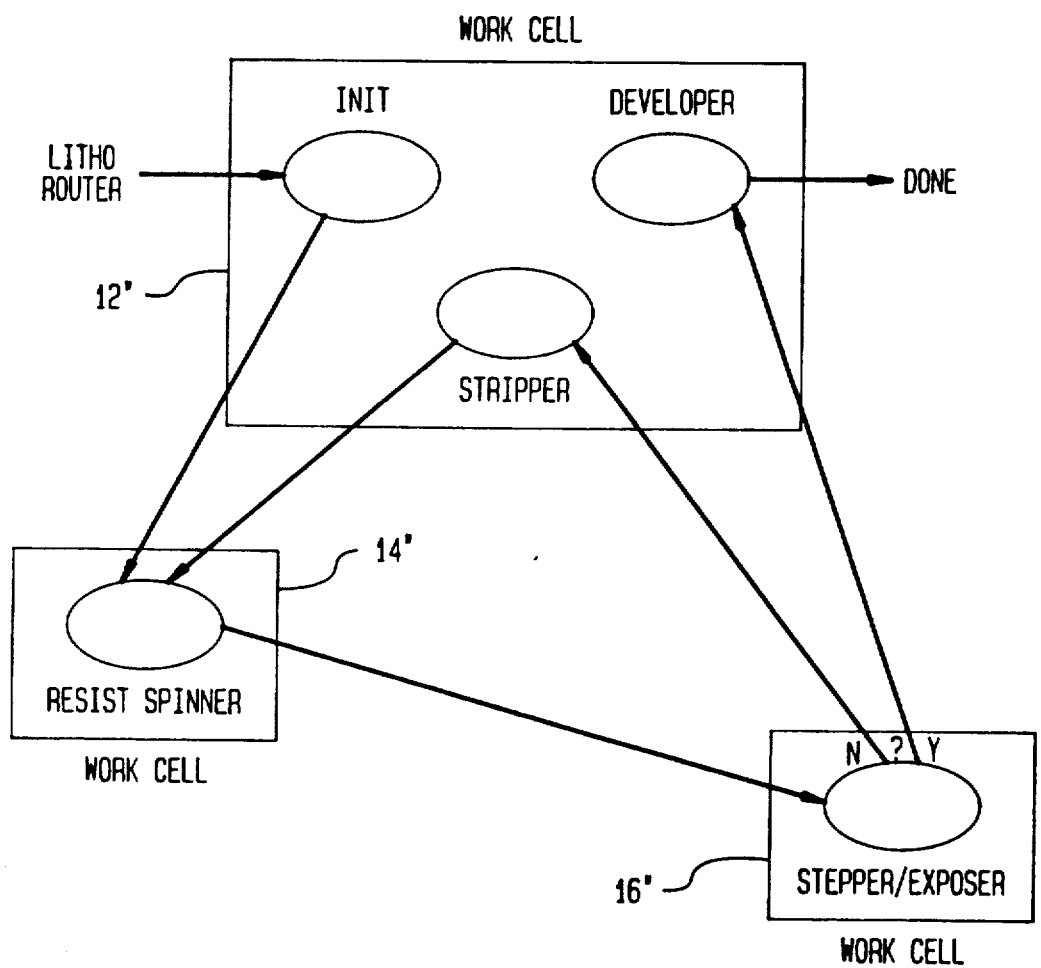
FIG. 4 is a flow diagram of a router program which may be implemented on the system of FIG. 1.

FIG. 4 is a flow diagram illustrating the path of a router, and its associated work unit, among the applicable work cells. In the following description, it should be understood that the unit is always transferred with the router whenever the router is transferred.

In FIG. 4, a router named "litho" is transferred to the initiation process of a work cell 12" via the MAP network (not shown). The initiation process of work cell 12" first unpackages router "litho." After presetting some internal variables in the router, the initiation process of work cell 12" repackages the router "litho" and transfers it, and its current execution state, to the photoresist application process of work cell 14". After the router "litho" is unpackaged at work cell 14", the operation portion of the router is executed, causing the spin-resist applying machine to apply the photoresist to the wafers in the associated unit. When that process is completed, the router is repackaged and transferred to the exposing process of work cell 16". After unpackaging the router, a stepper/exposer machine exposes the previously applied photoresist on the wafer, to produce the next mask layer on the wafer.

As a part of the exposure process, data is gathered regarding the accuracy of the exposure. This data may be gathered either from the manufacturing personnel, or from measurement equipment in the machine itself. This data may be used to determine further processing steps of the unit. In the illustrated embodiment, a yes-or-no decision is requested from manufacturing personnel. Alternatively, more detailed information relating to the processing step may be requested from manufacturing personnel, or numerical data concerning the manufacturing operation may be gathered from the machine. Numerical data may be compared to threshold values to determine further processing.

In FIG. 4, the router is repackaged and sent to one of two processes in work cell 12". If the exposure was made properly, then the router is repackaged and sent to the photoresist developer process in work cell 12". This process develops the previously applied photoresist layer. After this step, the router is sent to subsequent work cells for further processing.

If the exposure was not made properly, then the router is repackaged and sent to the photoresist stripper process in work cell 12". This process strips off the improperly exposed photoresist and prepares the wafer for a new layer of photoresist. The router is then repackaged and sent to the spin-resist applying process in work cell 14", and the applying/exposing/developing steps are tried again. A limit on the number of retries may be set in the router, for example, after two retries, the unit of wafers may be scrapped.

When the router is completed, a terminating statement in the procedural language in which the router is written causes the router to halt execution on the system and to be transferred to the end unit node 50 of FIG. 1. The router may be stored in archive storage by the processor at that node. The data in the router may also be further processed or sent to other computer systems.

A method and apparatus for executing a program in a heterogeneous multiple computer system has been described in reference to a factory automation system. It should be understood that the same principles could be applied to an office automation system, or whenever data may be processed by such a system.

What we claim is:

1. In a distributed heterogeneous multiple computer system having a plurality of autonomous nodes, a method of executing a work sequence program, comprising data associated with a work unit and specifications for performing a plurality of successive work operations in sequence on said work unit utilizing said data, said method comprising the steps of:

writing said work sequence program in a standard language, and using said standard language to define a structure of the data used in said work sequence program and to specify a sequence of work operations to be performed on said work unit using said associated data at each one of a selected sequence of autonomous nodes;

providing a processor at each of the autonomous nodes for executing a work operation program for performing a work operation on a work unit at the respective node, said processor being operated in a given processor operating environment which may differ from the processor operating environment of another processor at another node, and using an interpreter for interpreting the standard language of the work sequence program into the given operating environment of the processor at the respective node;

initiating execution of said work sequence program on the processor at a first autonomous mode in said multiple computer system by using the processor interpreter to interpret said work sequence program into the processor operating environment of said processor and thereupon executing the work operation program of said processor on the work unit in accordance with the associated data and specifications for the work operations of said work sequence program; and transferring execution of said work sequence program to another processor at a second autonomous node in said multiple computer system in response to a next one of said successive work operations in the sequence specified in said work sequence program.

2. The method of claim 1, wherein said transferring step comprises the steps of:

halting execution of said program on said first autonomous node in response to said one of said successive operations; and resuming execution of said program on said second autonomous node.

3. The method of claim 2, further comprising the step of after said halting step, transferring said program to said second autonomous node in response to said one of said successive operations.

4. The method of claim 1, wherein said execution of said program is by interpreter embedded in said first and second autonomous nodes.

5. The method of claim 1, wherein said method is implemented on a multiple computer system in an automated factory in which each autonomous node in said multiple computer system is in a work cell in said factory.

6. The method of claim 5, wherein each autonomous node is coupled to a plurality of machines in its work cell, and said program contains operations which control said machines.

7. The method of claim 1, wherein said method is implemented on a multiple computer system in an automated office in which each autonomous node in said multiple computer system is in a different work area in said office.

8. A distributed heterogeneous multiple computer system having a plurality of autonomous nodes, for executing a work sequence program, consisting of data associated with a work unit and specifications for performing a plurality of successive work operations in sequence on said work unit utilizing said data, comprising:

means for writing said work sequence program in a standard language, and for using said standard language to define a structure of the data used in said work sequence program and to specify a sequence of work operations to be performed on said work unit using said associated data at each one of a selected sequence of autonomous nodes;

a processor provided at each of the autonomous nodes for executing a work operation program for performing a work operation on a work unit at the respective node, said processor being operated in a given processor operating environment which may differ from the processor operating environment of another processor at another node, and using an interpreter for interpreting the standard language of the work sequence program into the given operating environment of the processor at the respective node;

means for initiating execution of said work sequence program on the processor at a first autonomous mode in said multiple computer system, wherein said interpreter is used by said processor to interpret said work sequence program into the processor operating environment of said processor and said processor thereupon executes its work operation program on the work unit in accordance with the associated data and specifications for the work operations of said work sequence program; and means for transferring execution of said work sequence program to another processor at a second autonomous node in said multiple computer system in response to a next one of said successive work operations in the sequence specified in said work sequence program.

9. The system of claim 8, wherein said means for transferring comprises:

means for halting execution of said program on said first autonomous node in response to said one of said successive operations; and means for resuming execution of said program on said second autonomous node.

10. The system of claim 9, further comprising means for transferring said program to said second autonomous node in response to said one of said successive operations.

11. The system of claim 8, wherein each of said autonomous nodes comprise an interpreter for interpreting said program.

12. The method of claim 8, wherein said system is in an automated factory in which each autonomous node in said multiple computer system is in a work cell in said factory.

13. The system of claim 12, wherein each autonomous node is coupled to a plurality of machines in its work cell, and said program contains operations which control said machines.

14. The system of claim 8, wherein said system is in an automated office in which each autonomous node in said multiple computer system is in a different work area.

15. In a distributed heterogenous multiple computer system having a plurality of autonomous nodes, a method of interpretively executing a work sequence program, consisting of data associated with a work unit and specifications for performing a plurality of successive work operations in sequence on said work unit utilizing said data, said method comprising the steps of:

writing said work sequence program in a standard procedural language, and using said standard procedural language to define a structure of the data used in said work sequence program and to specify a sequence of work operations to be performed on said work unit using said associated data at each one of a selected sequence of autonomous nodes;

providing a processor at each of the autonomous nodes for executing a work operation program for performing a work operation on a work unit at the respective node, said processor being operated in a given processor operating environment which may differ from the processor operating environment of another processor at another node, and using an interpreter for interpreting the standard procedural language of the work sequence program into the given operating environment of the processor at the respective node;

initiating interpreting of said work sequence program on a first autonomous mode in said multiple computer system into the processor operating environment of the processor at said node in response to a first one of said successive work operations in the sequence specified in said work sequence program;

halting interpreting of said work sequence program on said processor at said first autonomous node in response to said first one of said successive work operations; and transferring said work sequence program to a second autonomous node in response to a next one of said successive work operations; and resuming interpreting of said work sequence program on said second autonomous node.

* * * * *

REEXAMINATION CERTIFICATE (3003rd)
United States Patent [19]
Wolfson et al.

[11] B1 5,126,932
[45] Certificate Issued Sep. 24, 1996

[54] METHOD AND APPARATUS FOR EXECUTING A PROGRAM IN A HETEROGENEOUS MULTIPLE COMPUTER SYSTEM

[75] Inventors: C. Daniel Wolfson, Langhorne, Pa.; Frederic W. Brehm, Mercerville, N.J.; Maura M. Flatley, South Brunswick Township, N.J.; Ellen M. Voorhees, Plainsboro, N.J.

[73] Assignee: Siemens Corporate Research, Inc., Princeton, N.J.

Reexamination Request:
No. 90/003,647, Nov. 30, 1994

Reexamination Certificate for:
Patent No.: 5,126,932
Issued: Jun. 30, 1992
Appl. No.: 506,503
Filed: Apr. 5, 1990

Related U.S. Application Data

[63] Continuation-in-part of Ser. No. 208,318, Jun. 17, 1988, abandoned.
[51] Int. Cl.$^6$ .......................... G06F 19/00; G06F 15/163
[52] U.S. Cl. ............................. 395/200.03; 364/DIG. 1; 364/221.9; 364/222; 364/222.2; 364/225; 364/226.7; 364/230; 364/230.3; 364/284.4; 364/468.06; 364/230.4; 364/236.2; 364/242.94; 364/242.95; 364/281.3; 364/281.8; 364/284; 364/284.3; 395/650
[58] Field of Search ...................... 364/131–136, 364/138, 139, 468, 401, 402, 403, DIG. 1, DIG. 2; 395/200.01, 200.02, 200.03, 600, 650, 200.05; 340/825.06, 825.07, 825.08

[56] References Cited

U.S. PATENT DOCUMENTS

| | | | |
|---|---|---|---|
| 4,918,620 | 4/1990 | Ulug | 395/75 |
| 4,932,026 | 6/1990 | Dev et al. | 370/94.1 |
| 4,943,932 | 7/1990 | Lark et al. | 395/76 |
| 5,093,794 | 3/1992 | Howie et al. | 364/194 |
| 5,113,393 | 5/1992 | Kam et al. | 370/94.1 |
| 5,195,041 | 3/1993 | George et al. | 364/468 |
| 5,260,868 | 11/1993 | Gupta et al. | 364/402 |

FOREIGN PATENT DOCUMENTS

| | | |
|---|---|---|
| 85420167 | 4/1986 | European Pat. Off. |
| 0420461 | 4/1991 | European Pat. Off. |

OTHER PUBLICATIONS

Abstract and claims of European Patent Application Publication No. 0 420 461 A2 to Texas Instruments, Incorporated published Apr. 3, 1991.

Primary Examiner—Joseph Ruggiero

[57] ABSTRACT

A program, consisting of data and a plurality of successive operations on the data, is executed on a distributed heterogeneous multiple computer system having a plurality of autonomous nodes each including a processor and associated memory. A control arrangement initiates execution of the program on a first autonomous node in the multiple computer system. A coupling arrangement transfers execution of the program to a second autonomous node in the multiple computer system in response to one of the successive operations in the program.

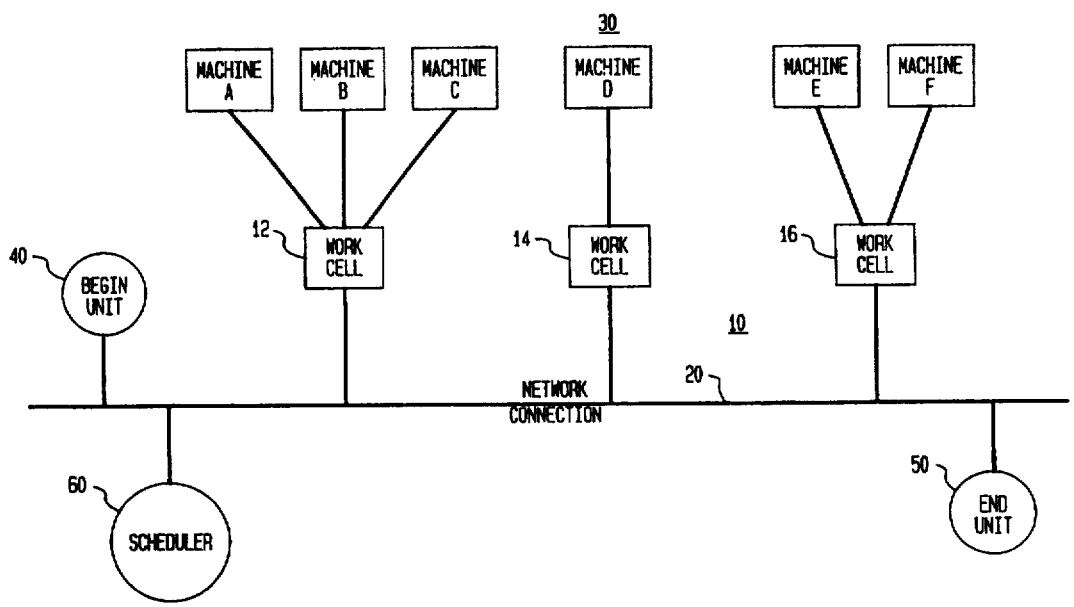

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 8 and 15 are determined to be patentable as amended.

Claims 2–7 and 9–14 dependent on an amended claim, are determined to be patentable.

New claims 16–31 are added and determined to be patentable.

1. In a distributed heterogeneous multiple computer system having a plurality of autonomous nodes, a method of executing a work sequence program, comprising data associated with a work unit and specifications for performing a plurality of successive work operations in sequence on said work unit utilizing said data, said method comprising the steps of:
   writing said work sequence program in a standard language, and using said standard language to define a structure of the data used in said work sequence program and to specify a sequence of work operations to be performed on said work unit using said associated data at each one of a selected sequence of autonomous nodes;
   providing a processor at each of the autonomous nodes for executing a work operation program for performing a work operation on a work unit at the respective node, said processor being operated [in] *with* a given processor operating [environment] *language* which [may differ] *differs* from [the] *at least one other* processor operating [environment] *language* of another processor at another node, and using [an] *a non-state retaining* interpreter for interpreting the standard language of the work sequence program into the given opeating [environment] *language* of the processor at the respective node;
   initiating execution of said work sequence program on the processor at a first autonomous [mode] *node* in said multiple computer system by using the processor interpreter to interpret said work sequence program into the processor operating [environment] *language* of said processor and thereupon executing the work operation program of said processor on the work unit in accordance with the associated data and specifications for the work operations of said work sequence program; and
   transferring execution of said work sequence program to another processor at a second autonomous node in said multiple computer system in response to a next one of said successive work operations in the sequence specified in said work sequence program.

8. A distributed heterogeneous multiple computer system having a plurality of autonomous nodes, for executing a work sequence program, consisting of data associated with a work unit and specifications for performing a plurality of successive work operations in sequence on said work unit utilizing said data, comprising:
   means for writing said work sequence program in a standard language, and for using said standard language to define a structure of the data used in said work sequence program and to specify a sequence of work operations to be performed on said work unit using said associated data at each one of a selected sequence of autonomous nodes;
   a processor provided at each of the autonomous nodes for executing a work operation program for performing a work operation on a work unit at the respective node, said processor being operated [in] *with* a given processor operating [environment] *language* which [may differ] *differs* from [the] *at least one other* processor operating [environment] *language* of another processor at another node, and using [an] *a non-state retaining* interpreter for interpreting the standard language of the work sequence program into the given operating [environment] *language* of the processor at the respective node;
   means for initiating execution of said work sequence program on the processor at a first autonomous [mode] *node* in said multiple computer system, wherein said interpreter is used by said processor to interpret said work sequence program into the processor operating [environment] *language* of said processor and said processor thereupon executes its work operation program on the work unit in accordance with the associated data and specifications for the work operations of said work sequence program; and
   means for transferring execution of said work sequence program to another processor at a second autonomous node in said multiple computer system in response to a next one of said successive work operations in the sequence specified in said work sequence program.

15. In a distributed heterogeneous multiple computer system having a plurality of autonomous nodes, a method of interpretively executing a work sequence program, consisting of data associated with a work unit and specifications for performing a plurality of successive work operations in sequence on said work unit utilizing said data, said method comprising the steps of:
   writing said work sequence program in a standard procedural language, and using said standard procedural language to define a structure of the data used in said work sequence program and to specify a sequence of work operations to be performed on said work unit using said associated data at each one of a selected sequence of autonomous nodes;
   providing a processor at each of the autonomous nodes for executing a work operation program for performing a work operation on a work unit at the respective node, said processor being operated [in] *with* a given processor operating [environment] *language* which [may differ] *differs* from [the] *at least one other* processor operating [environment] *language* of another processor at another node, and using [an] *a non-state retaining* interpreter for interpreting the standard procedural language of the work sequence program into the given operating [environment] *language* of the processor at the respective node, *such that no information about the work sequence program is retained by the interpreter*;
   initiating interpreting of said work sequence program on the processor on a first autonomous [mode] *node* in said multiple computer system into the processor operating [environment] *language* of the processor at said node in response to a first one of said successive work operations in the sequence specified in said work sequence program;

halting interpreting of said work sequence program on said processor at said first autonomous node in response to said first one of said successive work operations; [and]

transferring said work sequence program to a second autonomous node in response to a next one of said successive work operations; and resuming interpreting of said work sequence program on said second autonomous node.

16. The method of claim 1, wherein said transferring step further comprises the step of:

selecting said second autonomous node in response to said next successive work operation from a plurality of second autonomous nodes according to an autonomous scheduling program at an autonomous node, said scheduling program gathering information about which of said second autonomous nodes is next available.

17. The system of claim 8, further comprising:

means for selecting said second autonomous node in response to said next successive work operation from a plurality of second autonomous nodes according to an autonomous scheduling program at an autonomous node, said scheduling program gathering information about which of said second autonomous nodes is next available.

18. The method of claim 15, wherein said transferring step further comprises the step of:

selecting said second autonomous node in response to said next successive work operation from a plurality of second autonomous nodes according to an autonomous scheduling program at an autonomous node, said scheduling program gathering information about which of said second autonomous nodes is next available.

19. The method of claim 15, wherein said execution of said program is by an interpreter embedded in said first and second autonomous nodes.

20. The method of claim 15, wherein said method is implemented on a multiple computer system in an automated factory in which each autonomous node in said multiple computer system is in a work cell in said factory.

21. The method of claim 20, wherein each autonomous node is coupled to a plurality of machines in its work cell, and said program contains operations which control said machines.

22. The method of claim 15, wherein said method is implemented on a multiple computer system in an automated office in which each autonomous node in said multiple computer system is in a different work area in said office.

23. The method of claim 1, wherein said transferring step further comprises the steps of:

halting execution of said program on said first autonomous node in response to one of said successive operations;

selecting said second autonomous node in response to said next successive work operation from a plurality of second autonomous nodes according to an autonomous scheduling program at an autonomous node, said scheduling program gathering information about which of said second autonomous nodes is next available;

transferring said program to said second autonomous node in response to said one of said successive operations;

resuming execution of said program on said second autonomous node;

wherein said execution of said program is by an interpreter embedded in said first autonomous node and an interpreter embedded in said second autonomous node.

24. The method of claim 23 wherein said method is implemented on a multiple computer system in an automated factory in which each autonomous node is a work cell in said automated factory and said autonomous node is coupled to a plurality of machines, said program containing operations which control said machines.

25. The method of claim 23 wherein said method is implemented on a multiple computer system in an automated office in which each autonomous node in said multiple computer system is a different work area in said automated office.

26. The system of claim 8, wherein said means for transferring execution further comprises:

means for halting execution of said program on said first autonomous node in response to one of said successive operations;

means for selecting said second autonomous node in response to said next successive work operation from a plurality of second autonomous nodes according to an autonomous scheduling program at an autonomous node, said scheduling program gathering information about which of said second autonomous nodes is next available;

means for transferring said program to said second autonomous node in response to said one of said successive operations;

means for resuming execution of said program on said second autonomous node;

wherein said execution of said program is by an interpreter embedded in said first autonomous node and an interpreter embedded in said second autonomous node.

27. The system of claim 26 wherein said system is implemented on a multiple computer system in an automated factory in which each autonomous node is a work cell in said automated factory and said autonomous node is coupled to a plurality of machines, said program containing operations which control said machines.

28. The system of claim 26 wherein said system is implemented on a multiple computer system in an automated office in which each autonomous node is a different work area in said automated office.

29. The method of claim 18 wherein said execution of said program is by an interpreter embedded in said first autonomous node and an interpreter embedded in said second autonomous node.

30. The method of claim 29 wherein said method is implemented on a multiple computer system in an automated factory in which each autonomous node is a work cell in said automated factory and said autonomous node is coupled to a plurality of machines, said program containing operations which control said machines.

31. The method of claim 29 wherein said method is implemented on a multiple computer system in an automated office in which each autonomous node in said multiple computer system is a different work area in said automated office.

* * * * *